United States Patent
Bolis et al.

(10) Patent No.: US 8,674,489 B2
(45) Date of Patent: Mar. 18, 2014

(54) INTERCONNECT STRUCTURE WITH CAVITY HAVING ONE OR SEVERAL CONTACT RISES ON THE WALL OF THE CAVITY AND METHOD FOR PRODUCING SAME

(75) Inventors: Sebastien Bolis, Crolles (FR); Fabrice Jacquet, Saint Pierre de Mesage (FR); Damien Saint-Patrice, Chabeuil (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 406 days.

(21) Appl. No.: 12/912,203

(22) Filed: Oct. 26, 2010

(65) Prior Publication Data

US 2011/0097909 A1 Apr. 28, 2011

(30) Foreign Application Priority Data

Oct. 28, 2009 (FR) ...................................... 09 57588

(51) Int. Cl.
*H01L 23/02* (2006.01)
(52) U.S. Cl.
USPC ........................................................ 257/678
(58) Field of Classification Search
USPC ........ 257/678; 29/874; 439/68; 438/128, 455
See application file for complete search history.

(56) References Cited

U.S. PATENT DOCUMENTS

| | | | |
|---|---|---|---|
| 5,825,084 A | 10/1998 | Lau et al. | |
| 5,994,763 A | 11/1999 | Ohmuro | |
| 6,137,064 A | 10/2000 | Kiani et al. | |
| 6,891,272 B1* | 5/2005 | Fjelstad et al. | 257/774 |
| 2002/0191380 A1* | 12/2002 | Val | 361/760 |
| 2003/0224559 A1* | 12/2003 | Gross | 438/128 |
| 2006/0081396 A1* | 4/2006 | Hsu | 174/255 |
| 2006/0130321 A1 | 6/2006 | Kwong et al. | |
| 2007/0169961 A1* | 7/2007 | Kwong et al. | 174/266 |
| 2011/0086461 A1 | 4/2011 | Bolis | |

FOREIGN PATENT DOCUMENTS

WO WO 01/45172 A1 6/2001

OTHER PUBLICATIONS

U.S. Appl. No. 13/039,902, filed Mar. 3, 2011, Jacquet et al.
French Preliminary Search Report issued Jul. 5, 2010, in Patent Application No. FR 0957588.
European Search Report issued Dec. 29, 2010, in Patent Application No. 10189285.9.
European Search Report issued Dec. 29, 2010, in Patent Application No. 10189290.9.

(Continued)

*Primary Examiner* — Shaun Campbell
(74) *Attorney, Agent, or Firm* — Oblon, Spivak, McClelland, Maier & Neustadt, L.L.P.

(57) ABSTRACT

An interconnect device is disclosed including a support in which at least one hole is formed, the hole having walls forming a closed contour and being formed by a cavity and one or several slots communicating with the cavity. The slots extend in a direction making a non-zero angle with the main plane of the support. Several conducting elements are positioned on at least one wall of the hole and pass through the hole. The conducting elements are each intended to connect conducting areas to each other that are situated on either side of the support. At least one of the slots separates two of the conducting elements from each other.

18 Claims, 19 Drawing Sheets

(56) References Cited

OTHER PUBLICATIONS

Nga P. Pham, et al., "Spin, Spray coating and Electrodeposition of photoresist for MEMS structures—A comparison", DELFT University of Technology, Dimes, XP 7916419, Jan. 1, 2000, pp. 81-86.

C. S. Premachandran, et al., "A Novel, Wafer-Level Stacking Method for Low-Chip Yield and Non-Uniform, Chip-Size Wafers for MEMS and 3D SIP Applications", Electronic Components and Technology Conference, IEEE, 2008, pp. 314-318.

Sebastian Sosin, et al., "Fabrication of Through-Substrate Cavities for Hybrid Wafer-Level Packaging", MICRONED/MUFAC Program, Sep. 27, 2006, pp. 544-547.

"3-Dimensional Circuitry", Laser Direct Structuring Technology (LPKF-LDS™) for Moulded Interconnect Devices, LPKF Laser & Electronics, Jun. 22, 2009, pp. 1-12.

U.S. Appl. No. 13/031,917, filed Feb. 22, 2011, Saint-Patrice, et al.
U.S. Appl. No. 13/395,169, filed Mar. 9, 2012, Bolis, et al.
U.S. Appl. No. 13/394,641, filed Mar. 7, 2012, Moreau, et al.

\* cited by examiner

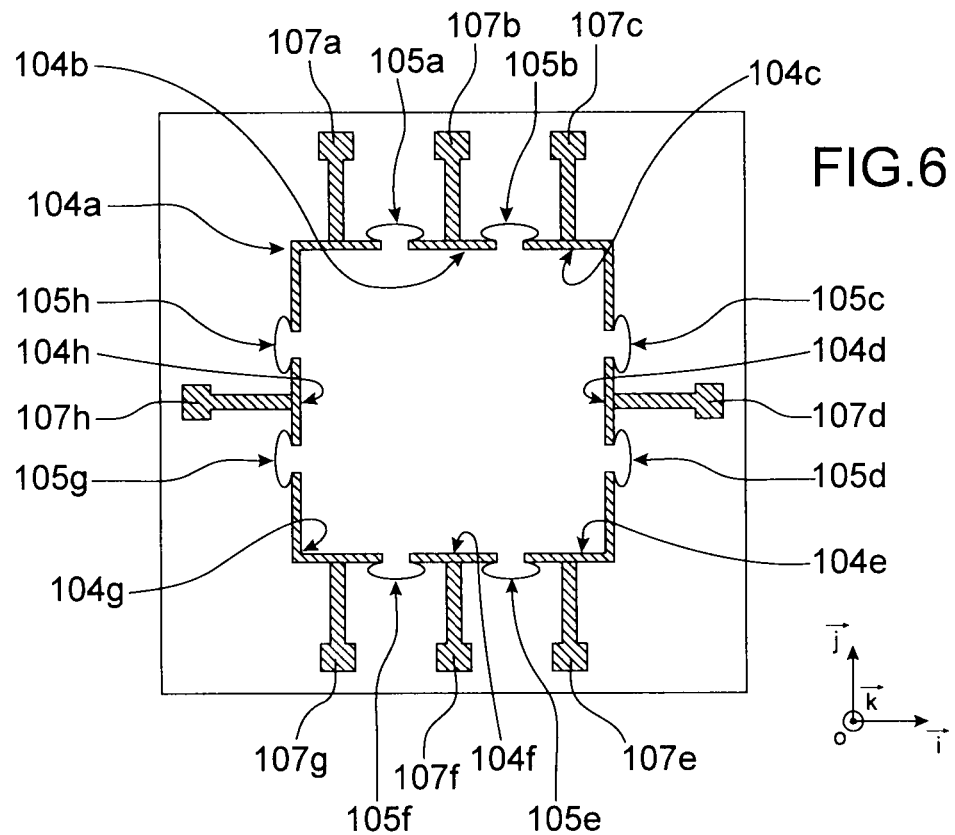
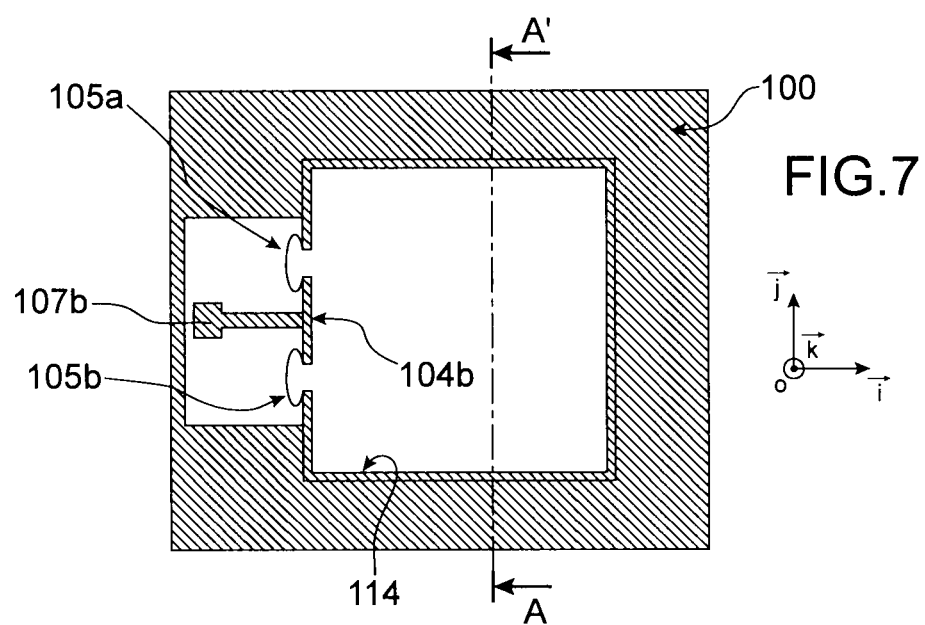

INTERCONNECT STRUCTURE WITH CAVITY HAVING ONE OR SEVERAL CONTACT RISES ON THE WALL OF THE CAVITY AND METHOD FOR PRODUCING SAME

TECHNICAL FIELD

The present invention concerns the field of microelectronics and microsystems, and more particularly that of interconnect structures in particular made during steps commonly called "waferlevel packaging" (WLP) steps, i.e. steps for making integrated circuit packages made on a wafer before cutting into elementary circuits.

It provides an improved interconnect structure with one or several contact rises in a cavity formed in a support in order to connect elements to each other that are situated on either side of the support, as well as a method for producing such a structure.

BACKGROUND OF THE INVENTION

The document "Spin, Spray coating and Electrodeposition of photoresist for MEMS structures—A comparison", Pham et al., Delft University of Technology, DIMES, presents interconnect structures including a contact rise made on the inclined walls of a cavity, with a conductive element making it possible to establish a contact between a conductive area situated in the cavity and another element situated above the cavity.

The production of contact rises poses a problem when the walls of the cavity are vertical.

Document WO 01/45172 presents a method for making a three-dimensional interconnect structure that is formed by producing slots by sawing the edge of a support, then depositing a metal material in said slots.

The interconnect structures thus formed must be situated near the edges of the support.

The problem arises of finding a new interconnect structure, that does not have the aforementioned drawbacks, and that is easier to implement, and a method for producing such a structure.

BRIEF DESCRIPTION OF THE INVENTION

The invention first concerns an interconnect device comprising a support in which at least one hole is formed, the hole having walls forming a closed contour and being formed by a cavity and one or several slots communicating with the cavity, at least part of the slots extending along the hole, the device also comprising one or several conductive elements positioned on at least one wall of the hole and passing through the latter part, the conductive elements each being intended to connect conductive areas to each other that are situated on either side of the support.

According to one possible embodiment, at least one of said slots separates two of said conductive elements from each other.

According to one possible embodiment, the device can include at least one conductive element housed in one of said grooves and extending along said slot.

The cavity can pass through the thickness of the support. According to one alternative, the cavity can be formed by a blind orifice formed in the support.

The support can be formed by several substrates and/or superimposed layers.

The cavity can be formed by a first opening made in a first substrate and a second opening with a section different from the first opening and made in a second substrate.

The slots can communicate with said first opening, one or several other slots formed in the second substrate along the cavity formed in said substrate communicating with the second opening.

The walls of the cavity can be covered with a conductive material. It is thus possible to form a protection against electromagnetic disruptions on the perimeter of the cavity.

The invention also concerns a method for producing an interconnect device as defined above, and comprising the steps consisting of:
  forming conducting pads passing through a support,
  forming a cavity in the thickness of the support so as to open and remove part of the conducting pads, the other part of the pads being kept and forming conducting elements housed in grooves.

The invention also concerns a method for producing an interconnect device as defined above, the method comprising the steps consisting of:
  forming a cavity in the thickness of a support,
  forming an area with a conducting base covering the walls of the cavity,
  forming at least one slot so as to open the conducting material, the slot communicating with the cavity.

The invention also concerns a method for producing an interconnect device as defined above, the method comprising the steps consisting of:
  forming a cavity in the thickness of a support and slots communicating with said cavity and extending over all or part thereof,
  forming a layer of sacrificial material in the slots, so as to separate the slots from the cavity,
  forming a conducting layer on the walls of the cavity,
  removing the layer of sacrificial material so as to remove portions of the conducting layer between the slots and the cavity.

The invention also concerns a method for producing an interconnect device as defined above, comprising the steps consisting of:
  forming a cavity in the thickness of the support,
  forming at least one slot communicating with said cavity and extending over all or part thereof, said slot being made such that it has, in a plane parallel to the support, a variable section with a narrowing at the connection between the slot and the cavity,
  performing a directional deposition of conducting material on said wall and on part of the slot.

BRIEF DESCRIPTION OF THE DRAWINGS

The present invention will be better understood upon reading the description of embodiments provided purely for information and non-limitingly in reference to the appended drawings, in which:

FIG. 6 illustrates a sixth example of an interconnect structure according to the invention, in which contact rises are formed all around the cavity, FIG. 7 illustrates a seventh example of an interconnect structure according to the invention provided with a cavity covered with conducting material insulated from a conducting element passing through the cavity via slots formed against the walls of the cavity.

Identical, similar, or equivalent parts of the different figures bear the same numerical references so as to facilitate the transition from one figure to the next.

The different parts shown in the figures are not necessarily shown using a uniform scale, to make the figures more legible.

DETAILED DESCRIPTION OF SPECIFIC EMBODIMENTS

Figure 1A:
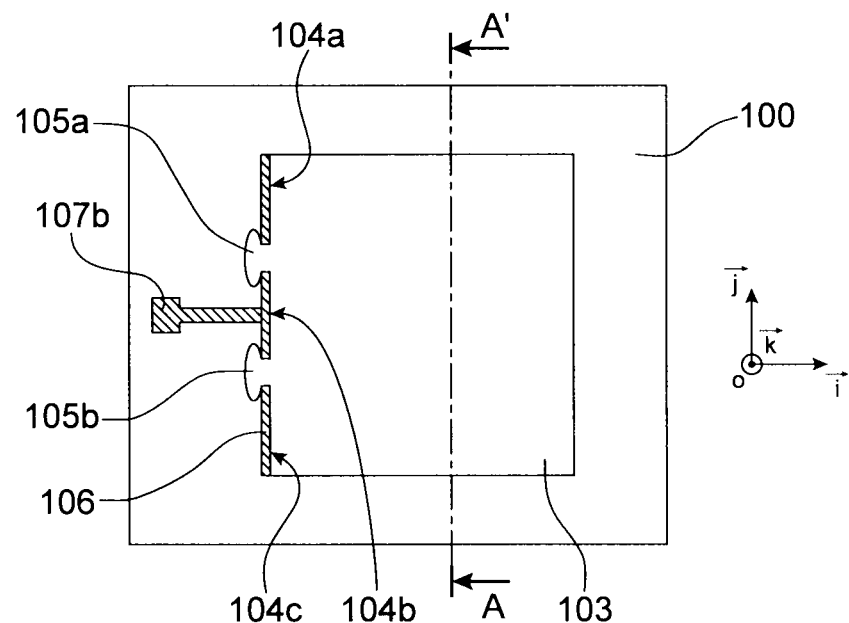
FIGS. 1A-1B illustrate a first example of an interconnect structure according to the invention, provided with a contact rise made in a cavity.
Figure 1B:
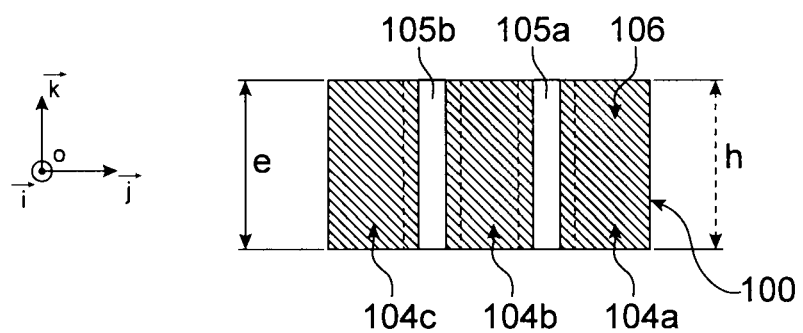

A first example of an interconnect structure implemented according to the invention is provided in FIGS. 1A-1B (FIG. 1A showing the structure in a top view while FIG. 1B illustrates the structure in a transverse cross-sectional view, the cutting plane being indicated in FIG. 1A).

The structure is made in a support 100 that can for example assume the form of a layer, or of a stack of several layers, or of a substrate, or of a stack of several substrates, or of an interposer, and includes a cavity 103 passing through the thickness of the support between its upper face (shown in FIG. 1A) and its lower face.

The support 100 can for example be made of a semiconductor material, or an insulating material, for example glass.

The interconnect structure makes it possible to connect elements or devices situated on either side of the lower face and the upper face of the support. The interconnect structure may be made in a central area of the support.

A vertical wall of the cavity 103 is covered with elements 104a, 104b, 104c, with a base of a conducting material 106 such as copper, aluminum, or tungsten, or polysilicon, for example.

The conducting elements 104a and 104b can assume the form of plates covering a vertical wall of the cavity 103 (the vertical direction being defined as a direction parallel to the vector $\vec{k}$ of the orthogonal reference [O; $\vec{i}$; $\vec{j}$; $\vec{k}$] provided in the figures).

The conducting elements 104a, 104b are separated from each other via a slot 105a communicating with the cavity 103 and formed at said vertical wall, while another slot 105b separates the conducting elements 104b and 104c. These slots 105a, 105b extend in the vertical direction and pass through the thickness e of the support 100 which, in this example, corresponds to the height h of the cavity 103.

The slots 105a, 105b and the cavity 103 communicating with the latter parts form a hole whereof the vertical walls form a closed contour.

The slots 105a, 105b and the cavity 103 can have been made simultaneously or successively, for example by etching such as DRIE (Deep reactive ion etching) or laser etching.

The slots 105a, 105b make it possible to ensure an electrical discontinuity between the conducting elements 104a, 104b, 104c.

Thus, the conducting elements 104a, 104b, 104c are not connected to each other or electrically connected to each other.

In this example, one of the conducting elements 104b is extended by a conducting track 107b that extends over the upper face of the support 100 parallel to the main plane thereof (the main plane of the support being defined as a plane passing through the latter part and parallel to the plane [O; $\vec{i}$; $\vec{j}$] given in the figures).

The through conducting elements 104a, 104b, 104c each make it possible to connect a device situated on or above the upper face of the support 100 and another device situated under or below the lower face of the support 100.

Figure 2:
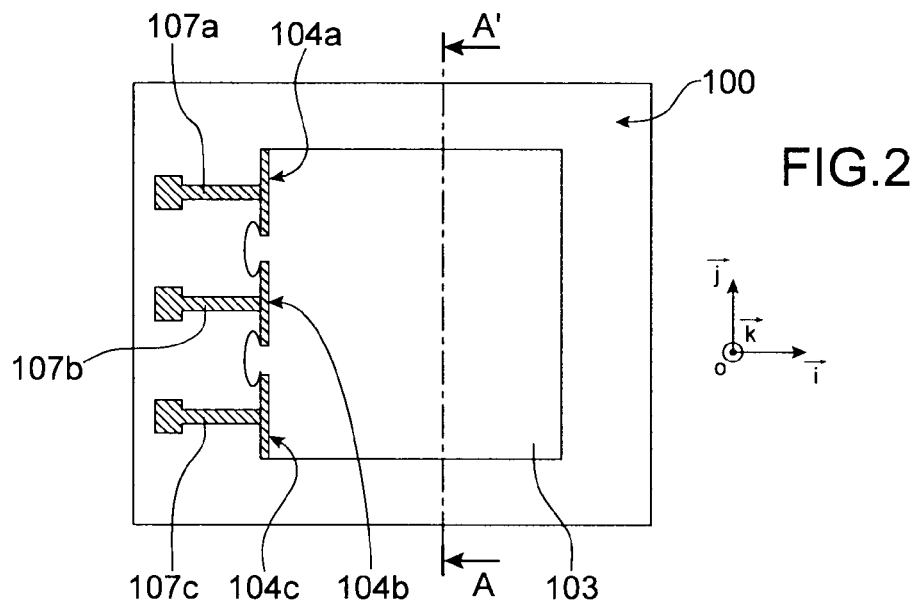
FIG. 2 illustrates a second example of an interconnect structure according to the invention, including conducting elements passing through a cavity and that are electrically insulated from each other via trenches communicating in the cavity.

According to one alternative (FIG. 2), the conducting elements 104a, 104b, 104c can be extended by conducting tracks 107a, 107b, 107c, respectively, that extend on the upper face of the support 100.

Figure 3A:
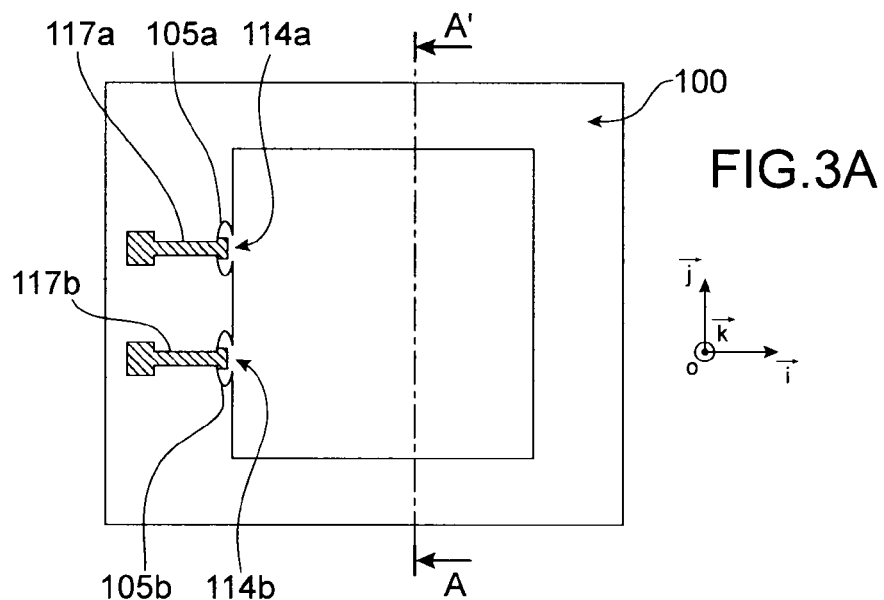
FIGS. 3A-3B illustrate a third example of an interconnect structure according to the invention, provided with a cavity and slots in which connecting elements pass.
Figure 3B:
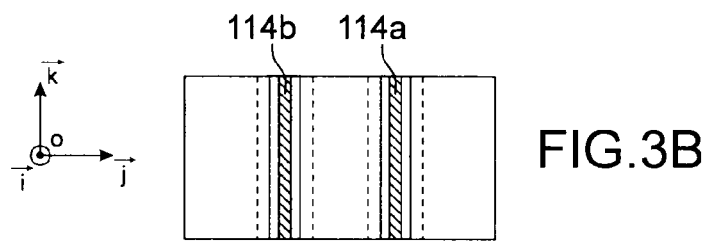

Another example of an interconnect structure is provided in FIGS. 3A-3B.

In this other example, vertical connecting elements 114a, 114b with a base of a conducting material in the form of conducting lines are also positioned in the slots 105a, 105b, and pass through the thickness of the support 100. The elements 114a, 114b, like the slots 105a, 105b, form a non-zero angle in relation to the main plane of the support and are, in this example, perpendicular to the main plane of the support.

The connecting elements 114a, 114b only cover a portion of the walls of the slots 105a, 105b.

The connecting elements 114a, 114b are extended by conducting tracks 117a, 117b, respectively, that extend on the upper face of the support 100.

Figure 4A:
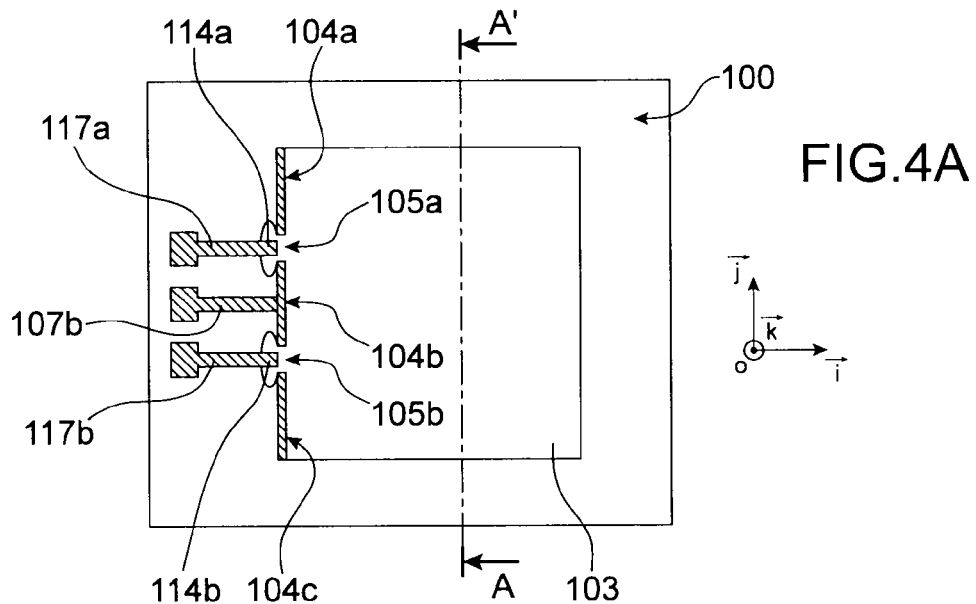
FIGS. 4A-4B illustrate a fourth example of an interconnect structure according to the invention, provided with contact rises passing through a cavity and insulated from each other by slots formed along the cavity in which connecting elements are provided.
Figure 4B:
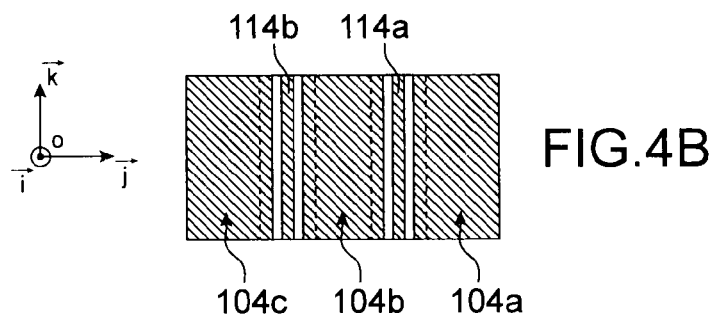

In the example provided in FIGS. 4A-4B, the structure includes conducting elements 104a, 104b, 104c on a wall of the cavity 103 and connecting elements 114a, 114b in the slots, the connecting elements 114a, 114b in the slots are connected to conducting tracks 117a, 117b, which extend on the upper face of the support, while the conducting element 104b is also connected to a track 107b resting on the support.

The connecting elements 114a, 114b only cover a portion of the slots 105a, 105b, the latter parts making it possible to ensure an electrical discontinuity between the connecting elements 114a, 114b and the conducting elements 104a, 104b, 104c. The slots 105a, 105b make it possible to separate and electrically insulate the connecting elements 104a, 104b, 104c, of the conducting elements 114a, 114b.

Figure 5:
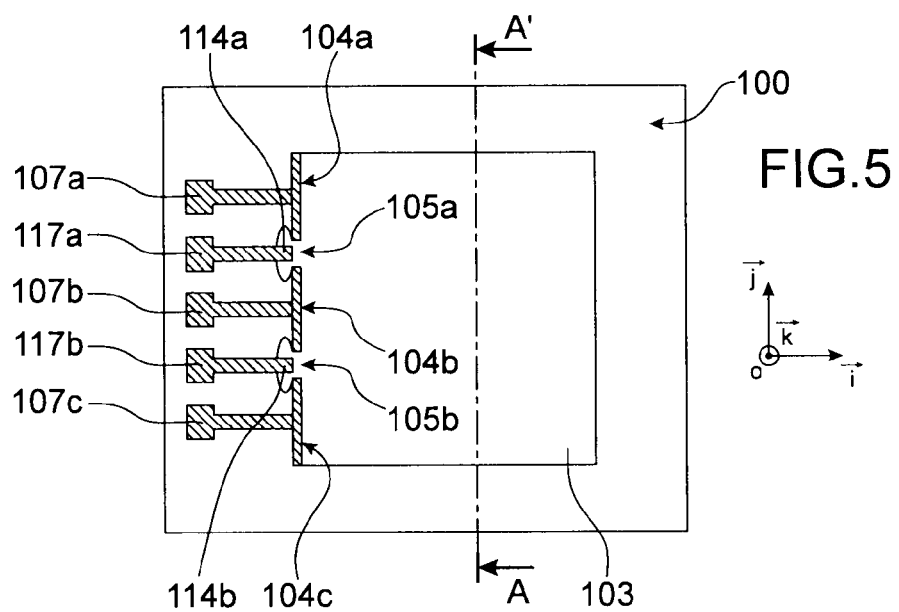
FIG. 5 illustrates a fifth example of an interconnect structure according to the invention.

In the example of FIG. 5, relative to the example previously described, the conducting elements 104a, 104c are also electrically connected to the conducting tracks 107a, 107c, positioned on the upper face of the support 100.

One example of a structure with a cavity 103 whereof the vertical walls are each covered with conducting elements, the conducting elements 104a, 104b, 104c, 104d, 104e, 104f, 104g, 104h being separated by a succession of slots 105a, 105b, 105c, 105d, 105e, 105f, 105g, 105h, formed all around the cavity 103 is provided in FIG. 6.

Another example of an interconnect structure formed in the cavity 103 is illustrated in FIG. 7. In this example, the vertical walls of the cavity 103 are completely covered by a conducting area 114, which also covers part of the upper face of the support 100.

A connecting element 104b formed on a vertical wall of the cavity 103 is separated and disconnected from the conducting area 114 by vertical slots 105a, 105b communicating with the cavity 103.

The connecting element 104b is extended by a conducting track 107b that extends on the upper face of the support 100.

A support area that is not covered with conducting material separates the conducting track 107b from the conducting area 114, such that the conducting area 114 and the conducting track 107b are not electrically connected.

Figure 8A:
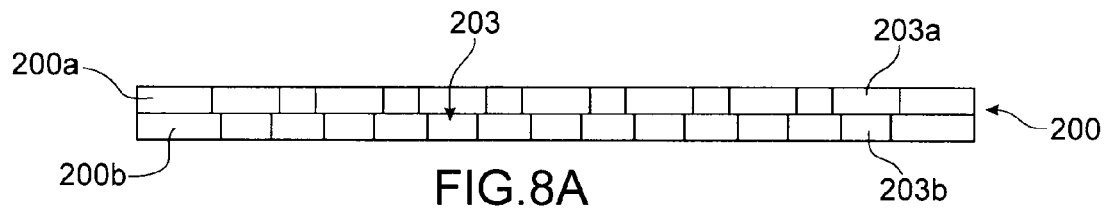
FIGS. 8A-8C illustrate an example of a support made up of two superimposed substrates in which cavities are formed.
Figure 8B:
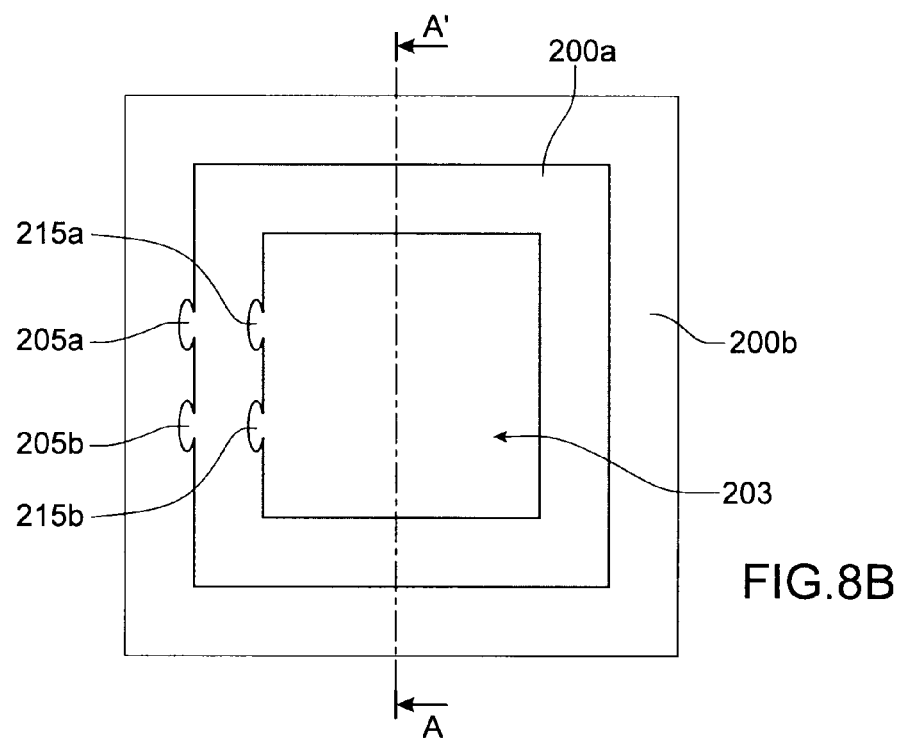
Figure 8C:
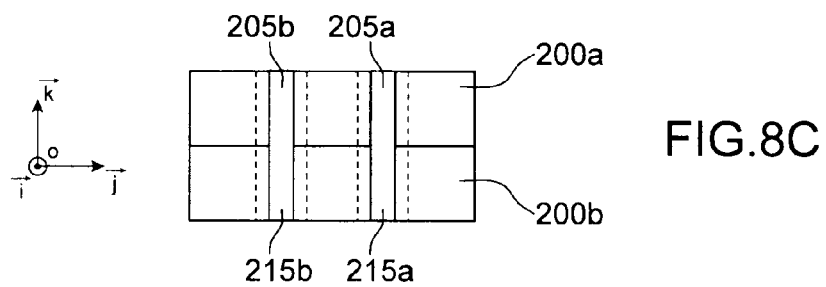

As illustrated in FIGS. 8A-8C (FIG. 8B illustrating the device according to a top view while FIGS. 8A and 8C show transverse cross-sectional views), an interconnect structure according to the invention can be made in a cavity 203 formed by several parts 203a, 203b with different dimensions in the thickness of a support 200.

The cavity or cavities 203 can be formed by a first part 203a, having given dimensions, and a second part 203b situated in the extension of the first part, the second part 203b having, in a plane parallel to the support, smaller dimensions than the first part 203a, the first part 203a and the second part 203b being defined by walls forming a stair profile. The stair configuration can make it possible for example to house a lens in the first part 203a and position it in relation to an imager using the second part 203b while also allowing an electrical contact rise along the stair-shaped cavity.

According to one possible embodiment, a stair profile including more than 2 stairs can be implemented.

The support 200 can possibly be made up of several layers or several stacked substrates, for example two layers 200a, 200b or two substrates 200a, 200b, which can be assembled by gluing, for example.

To that end, a glue seam 211 can for example be provided between the two substrates 200a, 200b.

Figure 20:
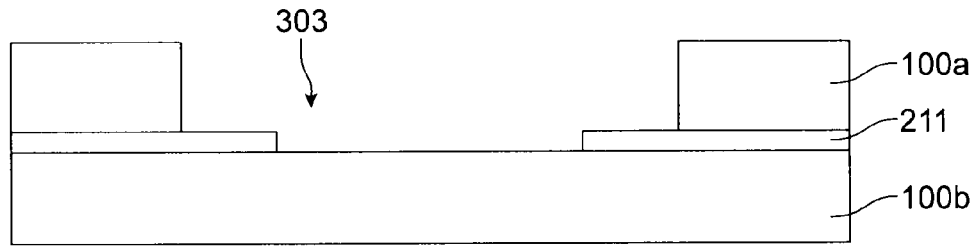
FIGS. 20 and 21 illustrate a support formed by two substrates assembled by gluing in which a cavity is made.
Figure 21:
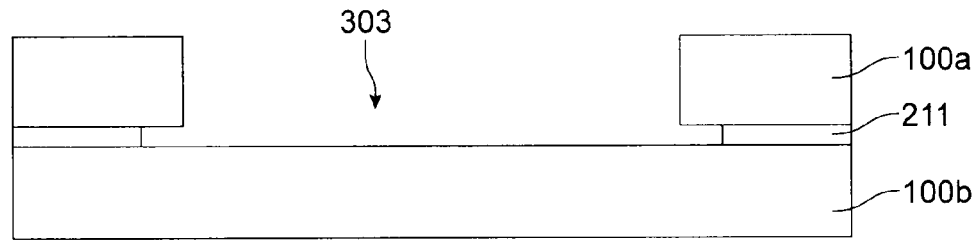

This glue seam 211 can be, according to a first case, formed so as to arrive in the cavity 203 (FIG. 20) or so as to be arranged withdrawn in relation to the walls of the cavity 203 (FIG. 21).

The first substrate 200a can include vertical slots 205a, 205b communicating with the first part 203a of the cavity 203 and formed in a wall of said first part 200a, while the second substrate 200b includes vertical slots 215a, 215b communicating with the second part 203b of the cavity 203 and formed in a wall of said second part 203b.

Figure 9A:
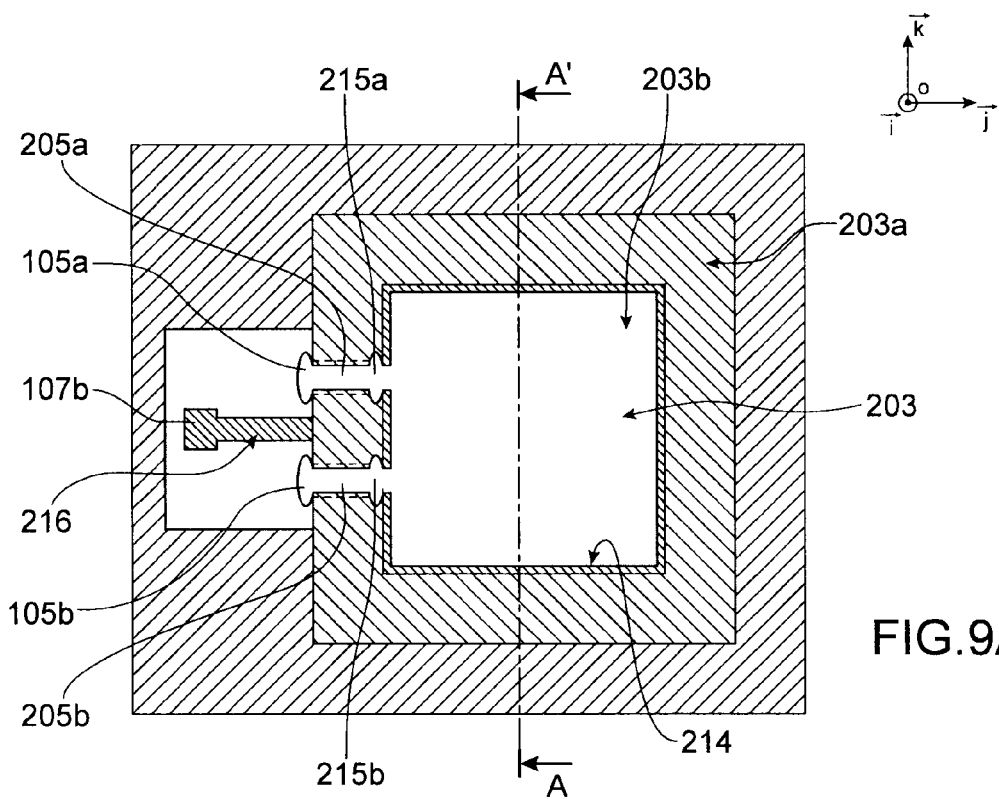
FIGS. 9A-9B illustrate another example of an interconnect structure according to the invention, formed in a cavity with several parts of different sections, each part including conducting areas insulated from each other by slots formed along the walls of the cavity, slots formed in one part of the cavity communicating via trenches with other slots formed in another part.
Figure 9B:
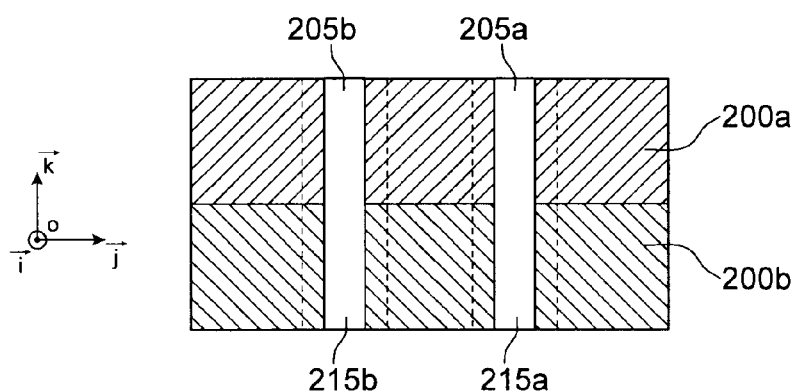

In FIGS. 9A-9B, an example of an interconnect structure provided with a support in which such a cavity 203 is formed, is provided.

In this structure, a first conducting area 214 covers a portion of the upper face of the first substrate 200a, part of the vertical walls of the first part 203a of the cavity 203, a portion of the upper face of the second substrate 200b situated at the bottom of said first part 203a, as well as a portion of the vertical walls of the second portion 203b of the cavity 203.

A second conducting area 216, separate from the first conducting area 214, is formed by a conducting strip 107b extending on the upper face of the first substrate 100a, extended in a portion covering a vertical wall of the first part 103a of the cavity, a portion of the upper face of the second substrate 100b situated at the bottom of said first part 103a, as well as a portion of the vertical walls of the second portion 103b of the cavity 103.

The first conducting area 214 and the second conducting area 216 are separated and electrically insulated from each other via vertical slots 205a, 205b formed in the first substrate 200a, 200b, horizontal trenches 208a, 208b (the horizontal direction being defined as a direction parallel to the plane [O; $\vec{i}$; $\vec{j}$] of the orthogonal reference [O; $\vec{i}$; $\vec{j}$; $\vec{k}$] given in the figures) formed on the second substrate 200b and communicating with the slots 205a, 205b, and vertical slots 215a, 215b formed in the second substrate 200b. The slots 205a, 205b, 215a, 215b communicate with the cavity.

Figure 33A:
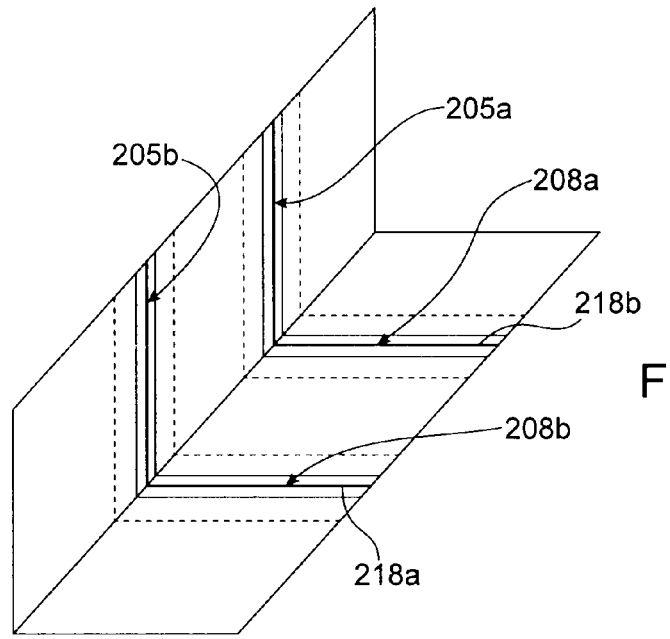
FIGS. 33A-33B illustrate an example of an embodiment of horizontal trenches.
Figure 33B:
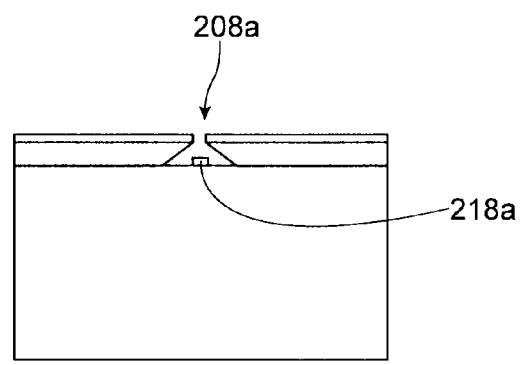

Another example of an embodiment of horizontal trenches 208a, 208b is given in FIGS. 33A-33B (the support being shown without conducting area in FIG. 33A).

In this other example, conducting areas 218a extend along trenches and include conducting areas that extend along the latter parts.

The trenches 208a, 208b can be formed such that their mouth is smaller than their bottom.

This can make it possible to form conducting areas 218a, 218b that only cover a portion of the bottom of the trenches.

These areas 218a, 218b can in fact be made by metal deposition, the metal only being deposited, by shadow effect due to the shape of the trenches 208a, 208b, on a portion of the bottom of the trenches.

Figure 10A:
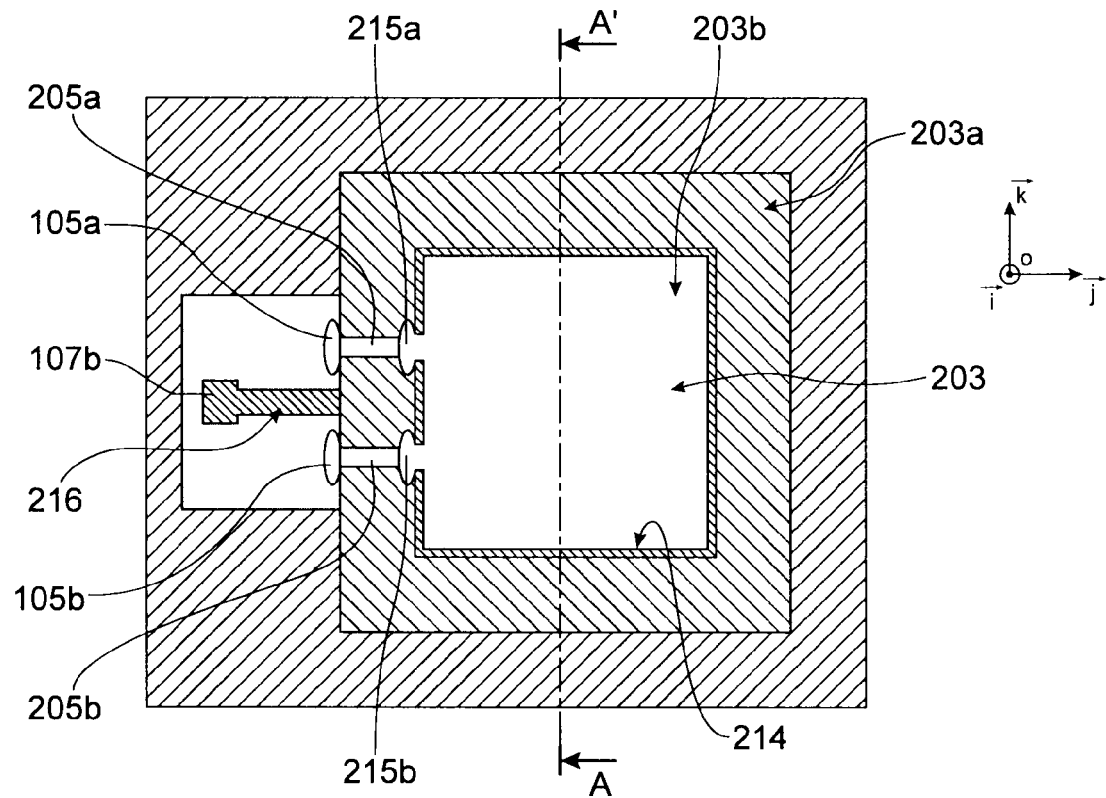
FIGS. 10A-10B illustrate another example of an interconnect structure according to the invention, formed in a cavity with several parts of different sections, each part including conducting areas insulated from each other by slots formed along the walls of the cavity.
Figure 10B:
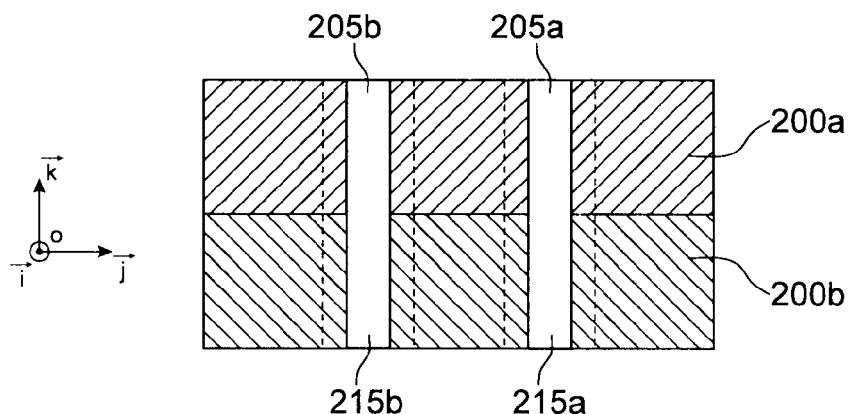

According to one alternative of the previously described example (FIGS. 10A-10B), the horizontal trenches 205a, 205b, formed in the second substrate 200b, are replaced by areas 206a, 206b of the second substrate 200b that are exposed and not covered with conducting material.

Figure 11A:
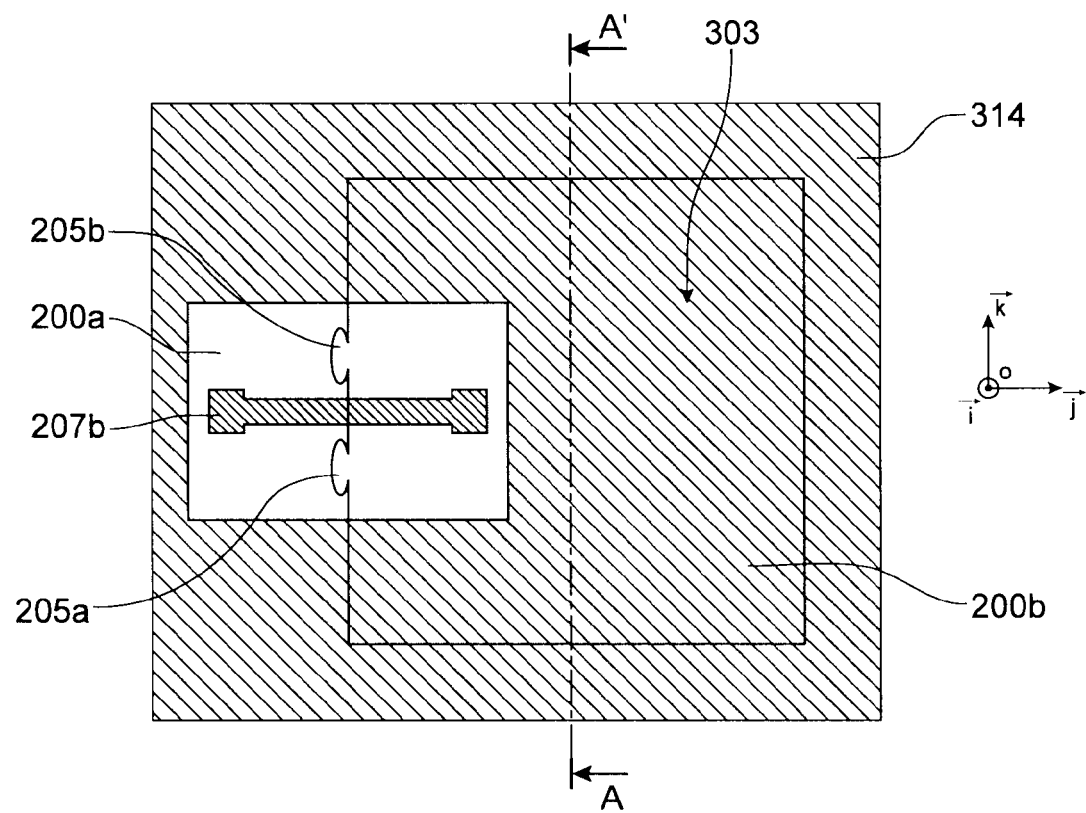
FIGS. 11A-11B illustrate another example of an interconnect structure according to the invention, formed in a blind cavity.
Figure 11B:
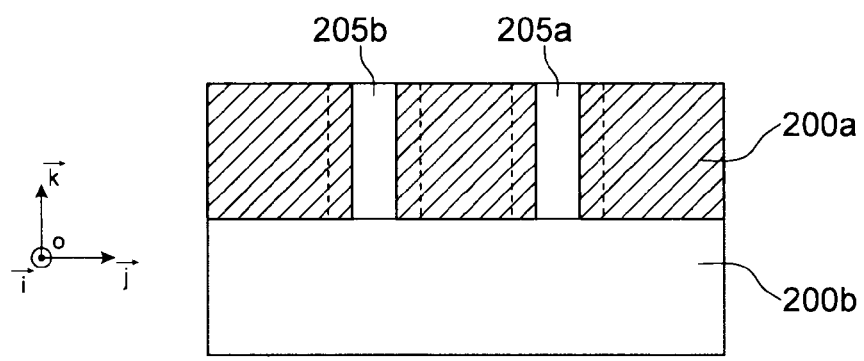

An interconnect structure with a "blind" cavity 303 can also be provided (FIGS. 11A and 11B).

In this case, the cavity 303 can be formed in the thickness of a first substrate 200a, resting on a second substrate 200b, the cavity 303 passing through the thickness of the first substrate 200a, and having a bottom at the second substrate 200b and that can be formed by the upper face thereof.

A portion of the upper face of the first substrate 200a, part of the walls of the cavity, as well as the upper face of the second substrate 200b are covered with a conducting area 314.

A metal track 207b extends on the upper face of the first substrate 200a, on a wall of the cavity 303, and on the upper face of the second substrate 200b.

This metal track 207b is separated and electrically insulated from the conducting area 314 via slots 105a, 105b formed in the walls of the cavity, as well as areas of the substrates 100a, 100b that are not covered with metal material.

Figure 12A:
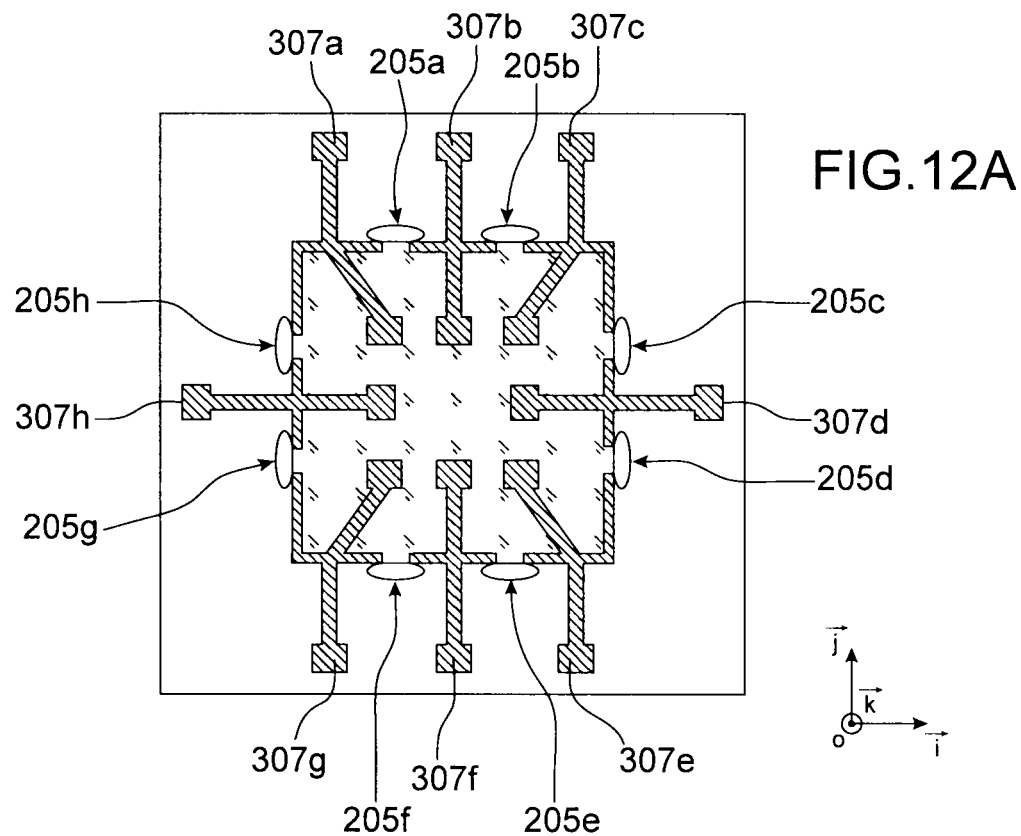
FIGS. 12A-12B illustrate another example of an interconnect structure according to the invention, made in a blind cavity, contact rises being provided on the entire perimeter of the cavity.
Figure 12B:
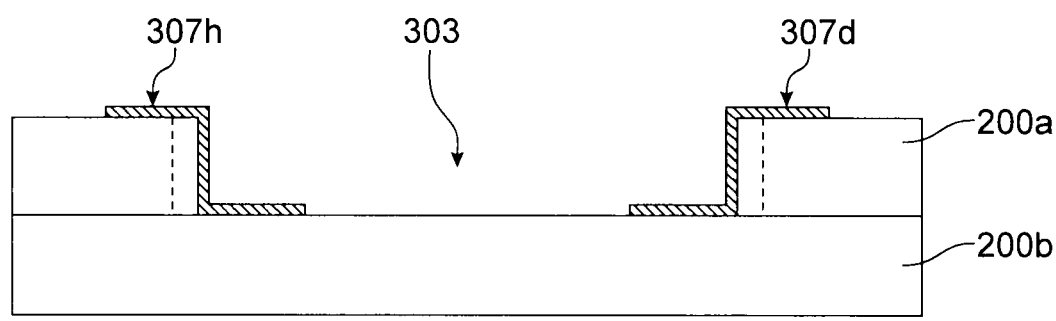

Another example of an interconnect structure with a blind cavity is provided in FIGS. 12A-12B. Slots 205a, 205b, 205c, 205d, 205e, 205f, 205g, 205h, are formed all around the cavity and electrically insulating conducting elements 307a, 307b, 307c, 307d, 307e, 307f, 307g, 307h from each other, each formed by a conducting track extending over the first substrate 200a, a conducting area covering one wall of the cavity, and another conducting track extending to the bottom of the cavity 303 on the second substrate 200b.

Figure 13:
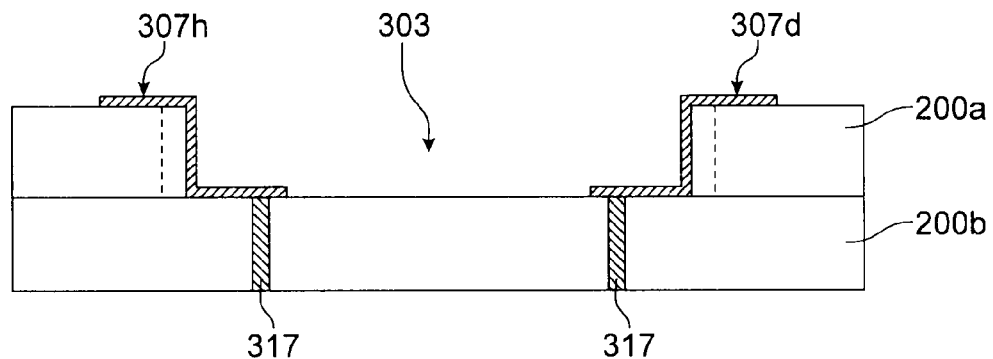
FIG. 13 illustrates an example of an interconnect structure according to the invention, formed in a blind cavity and connected to interconnect vias emerging at the bottom of the blind cavity.

According to one possible embodiment, the conducting elements 307a, 307b, 307c, 307d, 307e, 307f, 307g, 307h, can be connected to vias 317 passing through the second substrate 100b (FIG. 13).

Figure 14:
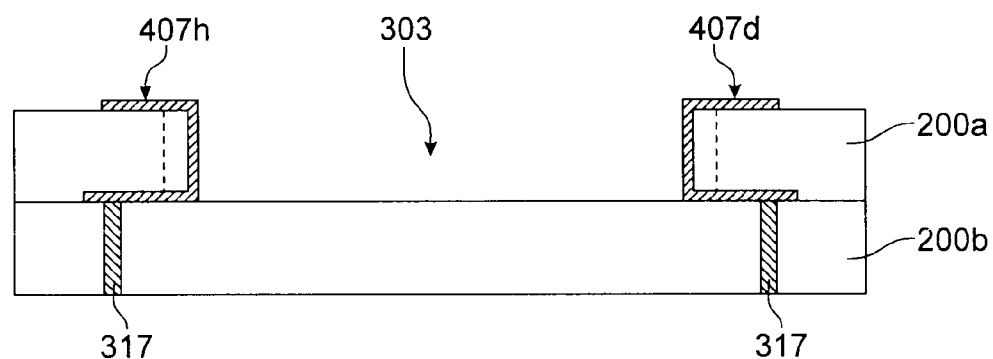
FIG. 14 illustrates an alternative of the example of an interconnect structure provided in FIG. 13, FIGS. 15 to 17 illustrate another example of an interconnect structure according to the invention with a blind cavity formed in a support in the form of two superimposed substrates between which an anisotropic conducting film is provided.

An alternative of this structure is provided in FIG. 14 and provides conducting elements 407h, 407d each formed by a conducting strip extending on the first substrate 100a, a conducting area covering a wall of the cavity, and another conducting strip situated between the first on the second substrate 100b, said other conducting strip being connected to a via 317.

Figure 15:
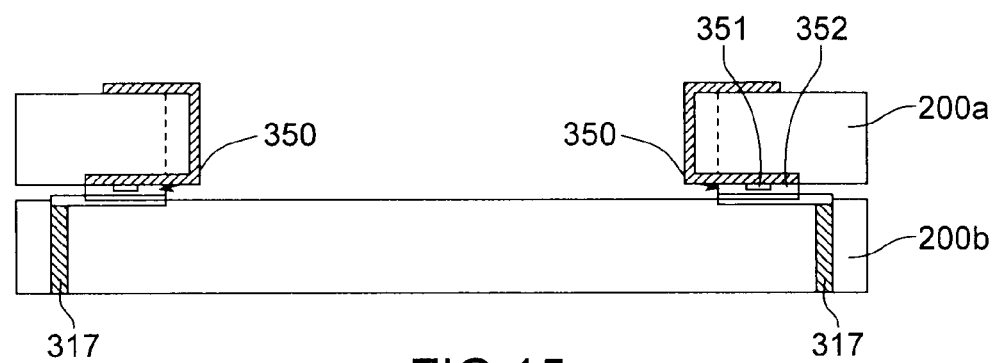
Figure 16:
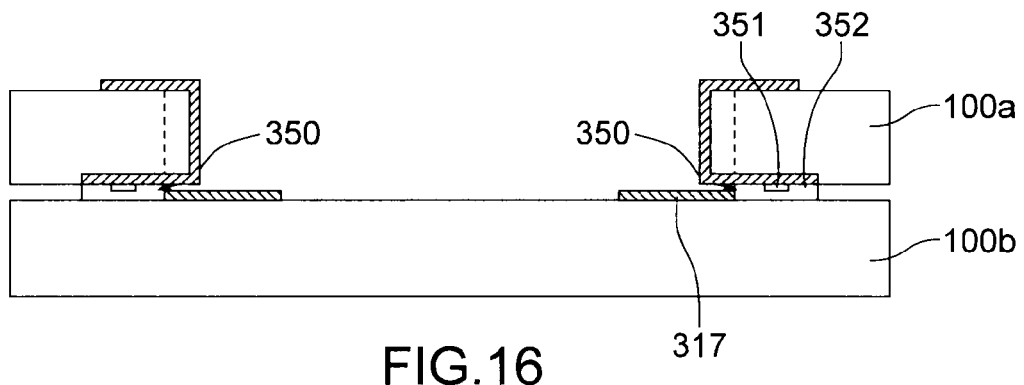
Figure 17:
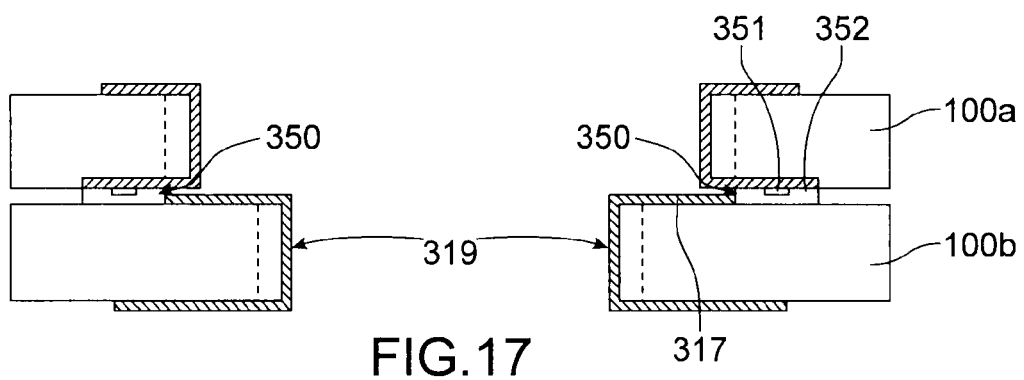

In the examples of structures of FIGS. 15, 16, 17, interconnect areas 350 formed by metal tracks 351 in a layer of dielectric material 352 are provided between the first substrate 100a and the second substrate 100b, and make it possible to establish a connection between the conducting elements 307h, 307d of the first substrate 100a and other conducting elements of the second substrate 100b, for example vias 317 passing through the second substrate 100b (FIG. 15) or metal areas 318 resting on the second substrate 100b (FIG. 16) or metal areas 319 covering portions of two faces of the second substrate 100b, as well as walls of an opening going through the second substrate 100b(FIG. 17).

Figure 18A:
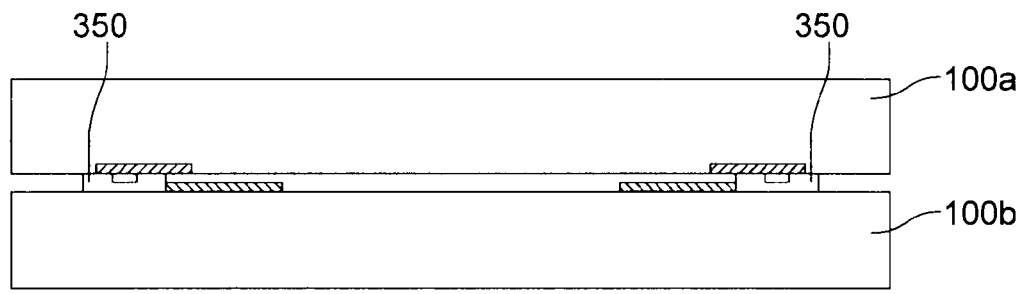
FIGS. 18A-18B illustrate an embodiment of a cavity in a support in the context of the implementation of an interconnect structure according to the invention.
Figure 18B:
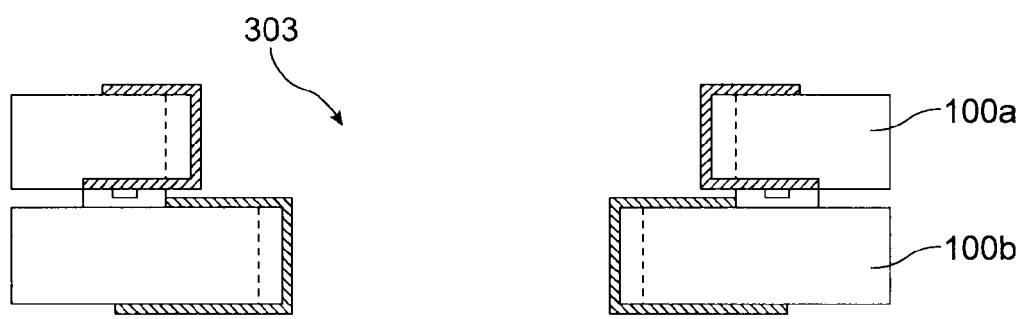

As illustrated in FIGS. 18A and 18B, the cavity of the interconnect structure previously described can be formed once the substrates 100a and 100b have been assembled and connected.

Figure 19A:
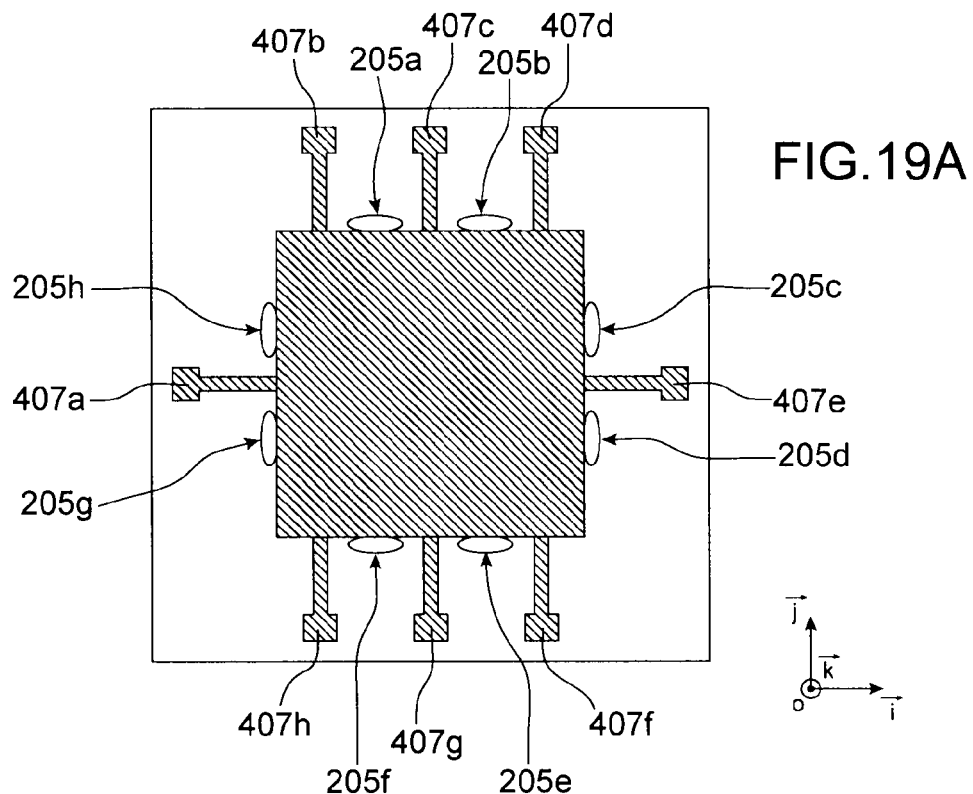
FIGS. 19A-19B illustrate an embodiment of an interconnect structure according to the invention.
Figure 19B:
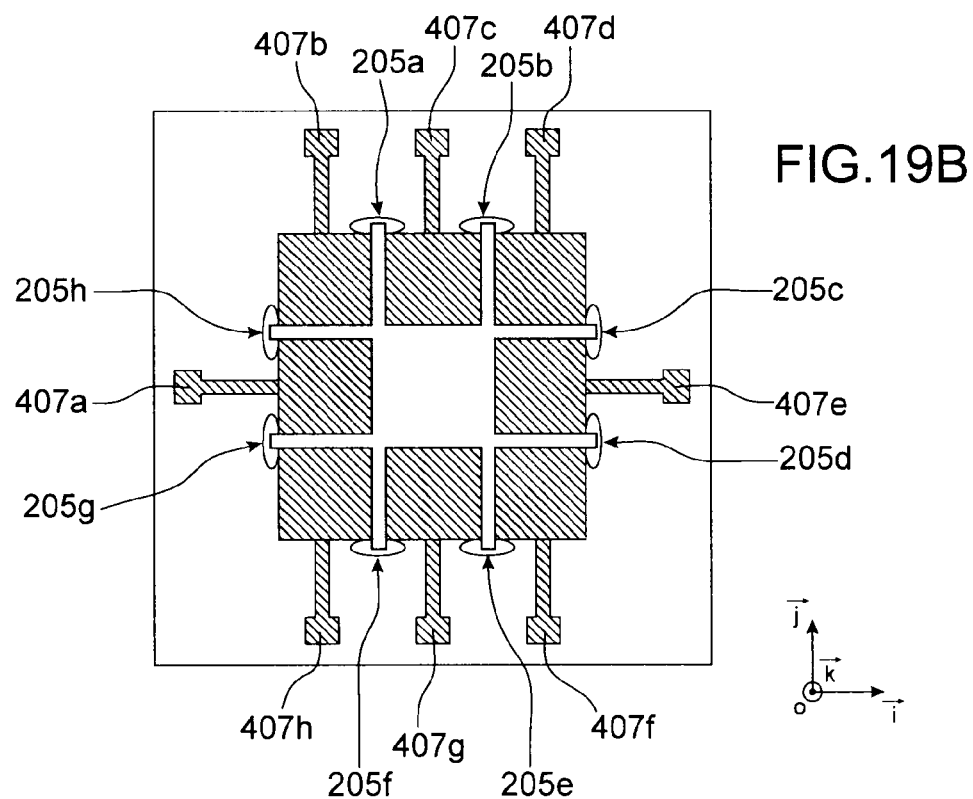

FIGS. 19A-19B illustrate an example of an embodiment of an interconnect structure in which the bottom and the walls of a blind cavity 303 are covered with a metal layer 416 at which metal strips 407a, 407b, 407c, 407d, 407e, 407f, 407g, 407h resting on the first substrate 100a are formed.

Vertical slots 205a, 205b, 205c, 205d, 205e, 205f, 205g, 205h formed all around the cavity 303 and communicating therewith insulate areas of the metal layer from each other in a direction orthogonal to the substrate (FIG. 19A).

Then, portions of the metal area 416 are removed from the bottom of the cavity 303.

The removal can be done such that the metal layer 416 is removed between grooves situated opposite each other on opposite walls of the cavity 303.

Figure 22A:
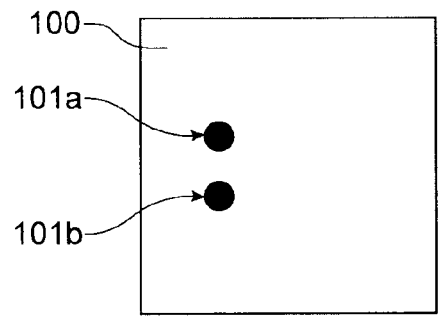
FIGS. 22A-22C illustrate an example of a method for making an interconnect structure according to the invention.
Figure 22B:
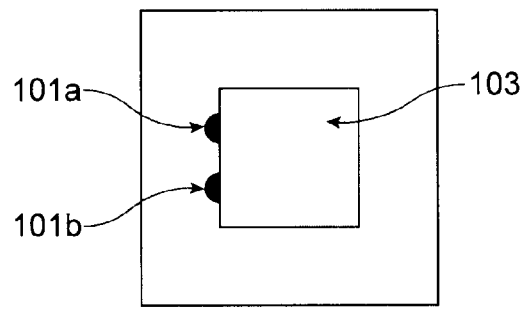
Figure 22C:
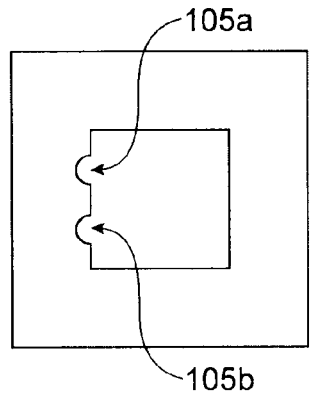

One example of a method for making a cavity provided with insulating slots as provided in an interconnect structure according to the invention is illustrated in FIGS. 22A-22C.

Pads 101a, 101b are first formed in the thickness of a support 100, which can be in the form of a layer or a stack of layers or a substrate (FIG. 22A).

The pads 101a, 101b can be conducting pads for example with a base of a metal material such as copper, aluminum, or tungsten, or polysilicon. These pads can be vias insulated through a thickness of dielectric material surrounding them.

A cavity 103 is then formed going through the support 100.

The cavity 103 is made so as to go through a portion of the support where part of the conducting pads 101a, 101b is situated, and then to open and remove a portion of the conducting pads 101a, 101b (FIG. 22B).

Figure 23A:
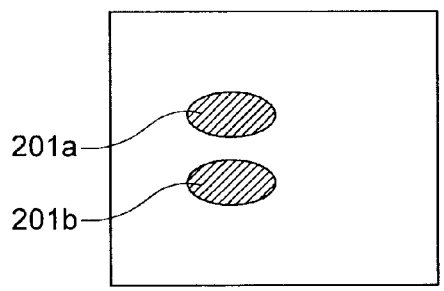
FIGS. 23A-23B illustrate another example of a method for making an interconnect structure according to the invention.
Figure 23B:
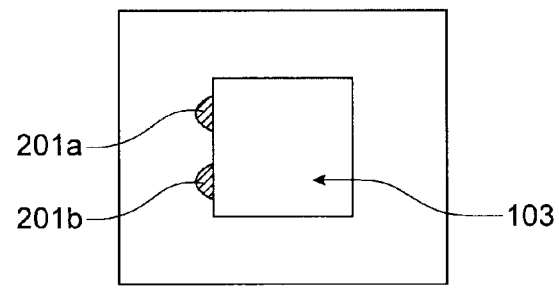

In the example of a production method of FIGS. 23A-23B, conducting pads 201a, 201b are first formed with a significant size in the support (FIG. 23A).

A cavity 103 is then formed going through the support 100 and an area where the conducting pads 201a, 201b are situated, and so as to open and remove a significant portion of the latter parts and keep another portion against a flank of the cavity 103 (FIG. 23B).

Figure 24A:
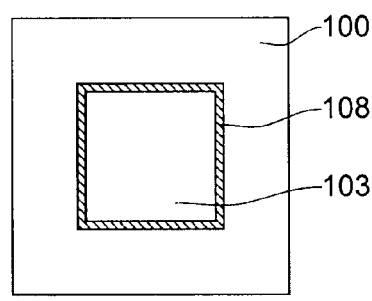
FIGS. 24A-24B illustrate another example of a method for making an interconnect structure according to the invention.

According to another example method, it is possible first to form a cavity 103 going through a support 100, then to cover the walls of the cavity using an area 108 of conducting material (FIG. 24A).

In the case where the support 100 has a base of semiconductor material, an insulating layer (not shown) can be deposited beforehand on the vertical walls of the cavity.

Slots 105a, 105b are then formed at the level of at least one vertical wall of the cavity, the slots 105a, 105b communicating with the cavity 103.

The slots 105a, 105b are made so as to remove portions of the area 108 of conducting material.

Figure 24B:
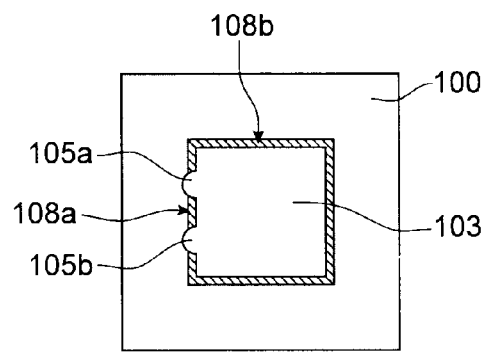

At the end of this removal, a first conducting area 108a covering part of the walls of the cavity 103 is separated from a conducting area 108b covering a part of a wall of the cavity 103, via slots 105a, 105b (FIG. 24B).

Figure 25A:
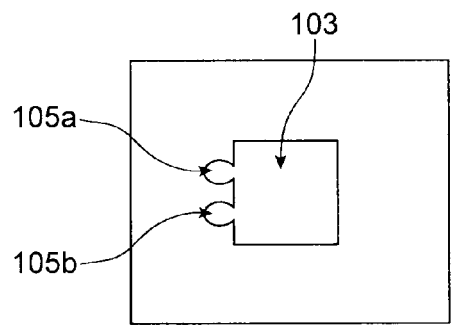
FIGS. 25A-25D illustrate another example of a method for making an interconnect structure according to the invention.

According to another example method, the cavity 103 and the slots 105a, 105b are formed in a support 100, at the same time or one after the other (FIG. 25A).

Figure 25B:
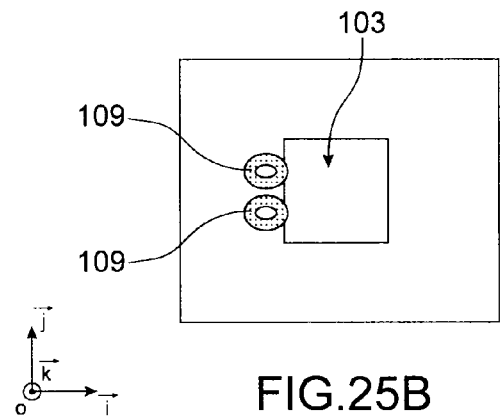

A layer of sacrificial material 109 is then deposited in the slots 105a, 105b or on the walls of the slots 105a, 105b, the sacrificial material 109 being distributed so as to form a separation between the cavity 103 and the slots 105a, 105b (FIG. 25B).

The layer of sacrificial material 109 can be provided so as to protrude in the cavity 103.

The sacrificial material 109 can for example be SiO$_2$ or Si$_3$N$_4$.

A layer of conducting material 108 is then deposited so as to cover the walls of the cavity 103 and cover the sacrificial material 109.

The material can for example be deposited by PVD (physical vapor deposition).

Figure 25C:
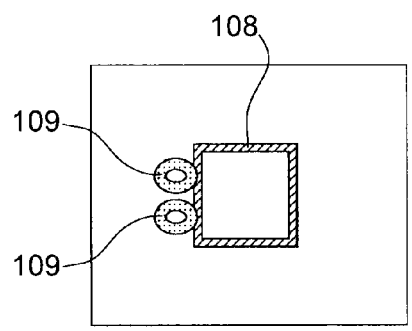

The thickness of the conducting material 108 can be provided to be smaller than the thickness of the layer of sacrificial material 109 protruding in the cavity 103 (FIG. 25C). The layer of sacrificial material 109 is then removed, which causes a removal of the conducting material 108 opposite the slots 105a, 105b for example by wet chemical etching.

Figure 25D:
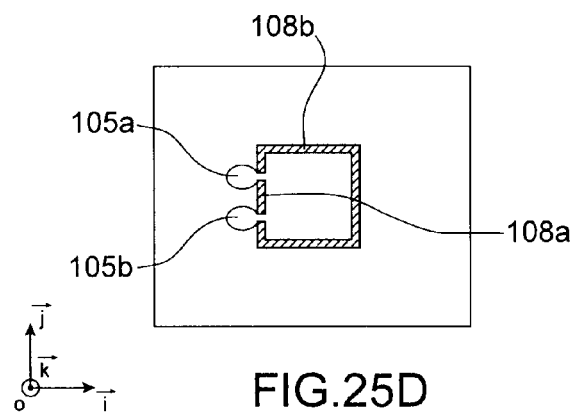

At the end of this removal, the conducting area 108 is in the form of two separate conducting parts 108a and 108b that are not connected to each other and are separated using slots 105a, 105b (FIG. 25D).

Figure 26:
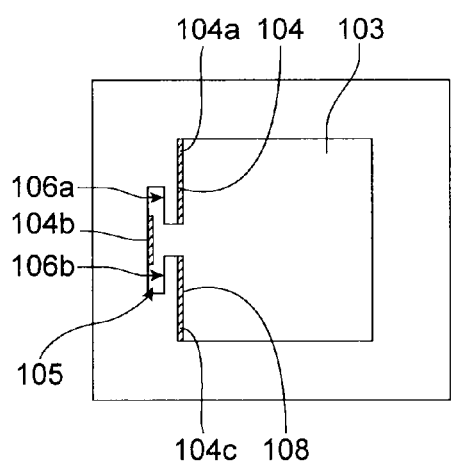
FIGS. 26 and 27 illustrate another example of a method for making an interconnect structure according to the invention.
Figure 27:
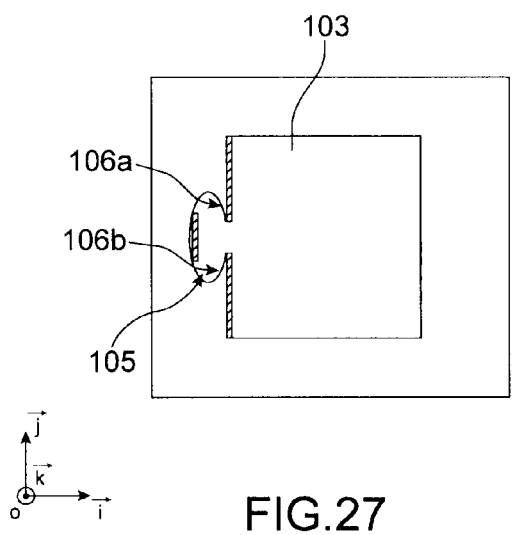

One example of a method for producing an interconnect structure is provided in FIGS. 26 and 27.

In this example, in the support 100, a cavity 103 is made going through the support 100, as well as at least one vertical slot 105 extending in the thickness of the support 100, and communicating with the cavity 103.

The slot can for example have a rectangular (FIG. 26) or oval (FIG. 27) section.

Parts 106a, 106b of a wall 104 of the cavity 103 form a separation between the latter part and the slot 105.

A metal deposition 108 is then done so as to cover a wall of the cavity and part of the slot 105. The parts 106a, 106b prevent a deposition of metal all around the slot such that the metal deposition on the wall 104 of the cavity and on the slot 105 forms a discontinuous area.

The metal deposition may be a so-called "directional" deposition in which the material is dispensed along a predetermined angle in relation to the main plane of the support (the main plane of the support being a plane passing through the latter and parallel to the plane [O; $\vec{i}$; $\vec{j}$] of the orthogonal reference [O; $\vec{i}$; $\vec{j}$; $\vec{k}$] given in the figures).

By shadow effect, the parts 106a, 106b prevent a metal deposition on the perimeter of the slot.

It is thus possible to make a connecting element 104b along the slot, which is disconnected from the conducting elements 104a and 104c formed on said wall during the metal deposition.

Figure 28A:
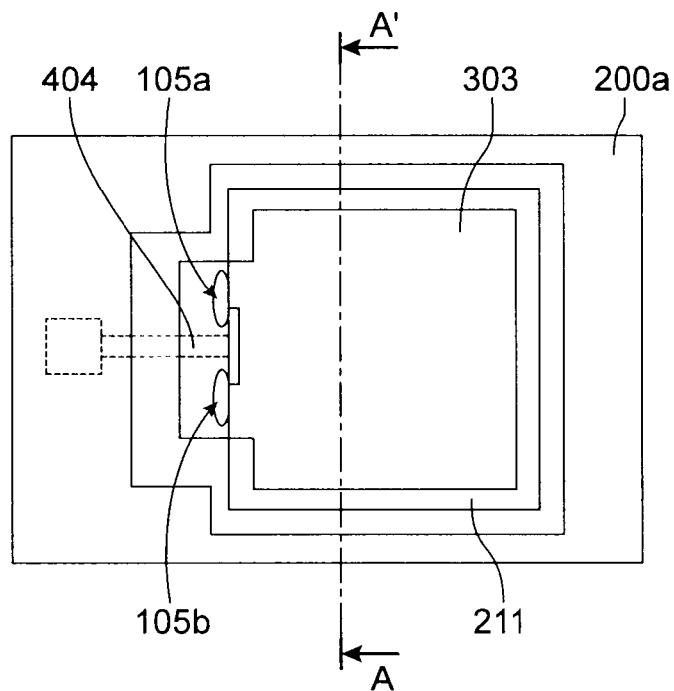
FIGS. 28A-28B, 29A-29B, 30A-30E illustrate an example of a method for making an interconnect structure with contact rise in a cavity and integrating such a structure into an imager device.
Figure 28B:
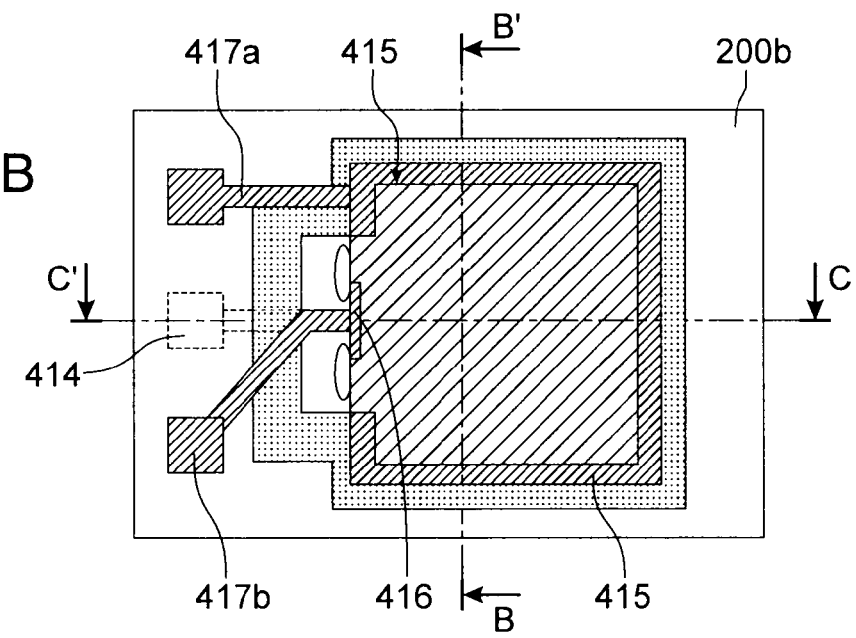
Figure 29A:
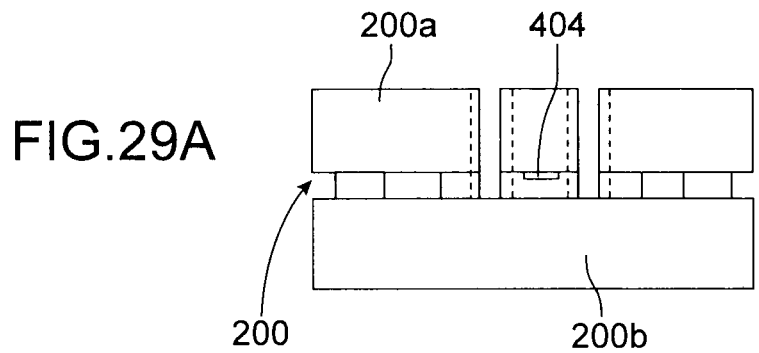
Figure 29B:
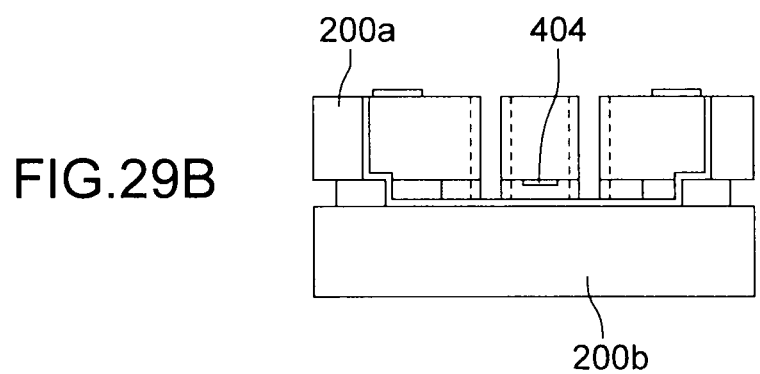

Another example of a method for making an interconnect structure is provided in FIGS. 28A-28B, and 29A-29B (FIGS. 28A-28B providing a top view, while FIGS. 29A-29B provide a transverse cross-sectional view whereof the cutting plane is indicated in FIGS. 28A-28B).

The interconnect structure can be made from a support 200 can possibly be made up of several layers or several stacked substrates, for example two layers 200a, 200b or two substrates 200a, 200b, which can be assembled by gluing, for example, using a glue seam 211.

A cavity 303 in the form of a blind orifice is provided in the first substrate 200a. Vertical slots 105a, 105b, i.e. orthogonal to the main plane of the support 200, were formed at a wall of the cavity and communicate therewith. Portions of the glue seam 211 are exposed by the cavity 303.

In this embodiment, the first substrate 200a includes at least one metal track 404 on its rear face, i.e. the face situated opposite the second substrate 200b (FIGS. 28A and 29A).

Sacrificial material is then deposited in the slots 105a, 105b, then metal material 414 is deposited in the cavity 303 and on the support 300.

The sacrificial material is then removed, then patterns are formed in the metal material, for example in a metal area 415 covering walls of the cavity 303, connected to a metal track 417a on the upper face of the support.

This step also leads to the formation of another metal area 416 separated from the metal area 415 by slots, covers a wall portion of the cavity situated between the slots 105a, 105b, and is extended by another metal track 417b formed on the upper face of the support (FIGS. 28B and 29B).

The interconnect structure with a cavity that has just been formed can be integrated or assembled with another device.

FIGS. 30A-30E show a method for making an imager device including such an interconnect structure.

Figure 30A:
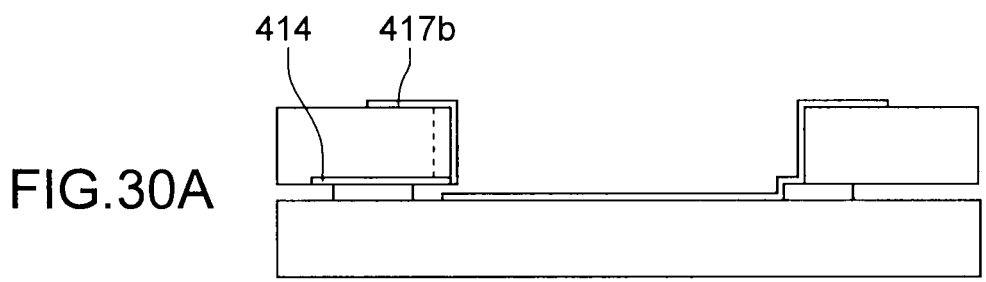

This method can be done from the structure previously formed (and described in connection with FIG. 30A showing the device of FIG. 28B in a cross-sectional view C'C).

Figure 30B:
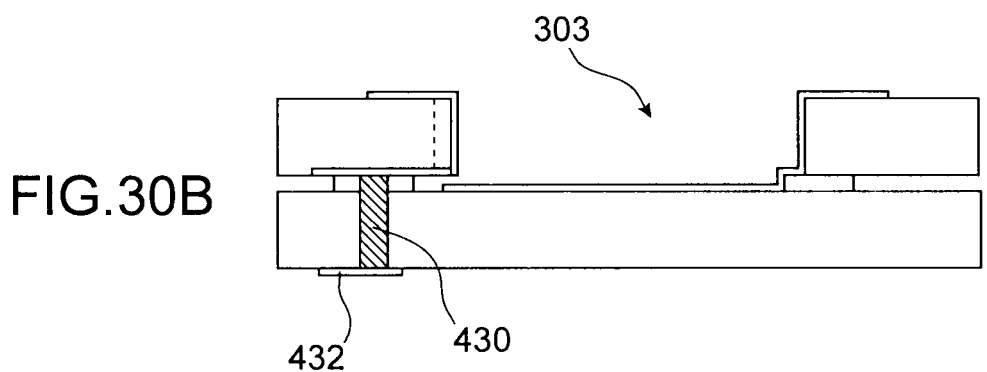

One or several vias 430 are then formed passing through the second support 200b as well as one or several connecting pads 432 on said support 200b, the pads being connected 432 to the vias (FIG. 30B).

Figure 30C:
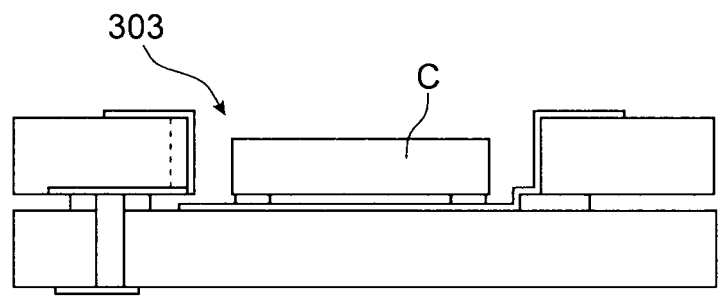

An optical component C, for example a fixed focal lens, a parallel plate, or a variable focal device is then placed in the cavity 303 and connected to the conducting area 415 formed in said cavity (FIG. 30C).

Figure 30D:
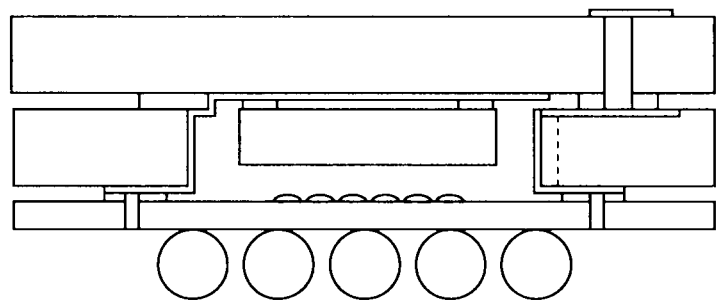

An imager substrate is then attached on the upper face of the first substrate 200a, the imager substrate being assembled and connected to the metal tracks 417a, 417b formed on the upper face of the first substrate 200a (FIG. 30D).

Figure 30E:
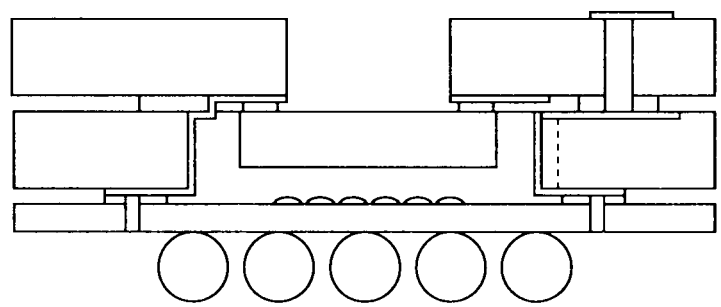

An opening is then made in the second substrate 200b, opposite the optical component C (FIG. 30E).

Figure 31:
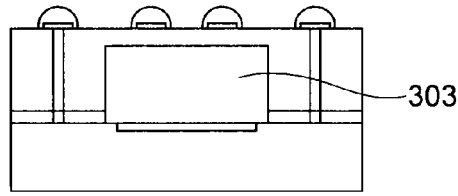
FIG. 31 illustrates an example of an optical device provided with a cavity in which an interconnect structure according to the invention can be formed.

An interconnect structure with a cavity as implemented according to the invention can be applied in the field of MEMS components, for example such as inertial sensors, accelerometers or gyrometers (FIG. 31).

Figure 32:
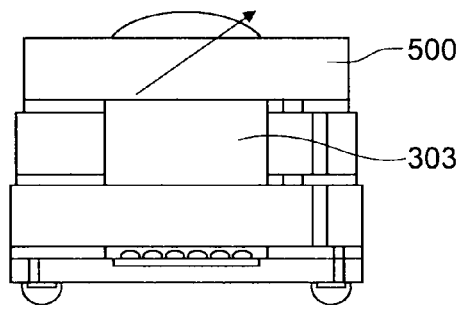
FIG. 32 illustrates an example of a MEMS device provided with a cavity in which an interconnect structure according to the invention can be formed.

FIG. 32 shows an example of a unitary camera made up an active optical element 500 set on the top of cavity 303, focused on the imager substrate.

Contact rises are implemented in the cavity 303 to power said active optical element.

The invention claimed is:

1. An interconnect device comprising:
a support formed by several superimposed substrates and/or layers in which at least one hole is formed, the hole having walls forming a closed contour and being formed by a cavity and one or several slots communicating with the cavity, the cavity is formed by a first opening made in a first substrate and a second opening, with a different cross-sectional area from the first opening and made in a second substrate, the one or several slots extending over all or part of the length of the hole, one or several conducting elements being positioned on at least one wall of the hole and passing through the hole, the one or several conducting elements each being intended to connect conducting areas to each other situated on either side of the support,
wherein at least one of the one or several conducting elements is housed in one of said one or several slots and covers less than an entire surface of said one of said one or several slots.

2. The interconnect device according to claim 1, wherein at least one of said one or several slots separates two of said several conducting elements from each other.

3. The interconnect device according to claim 1, wherein at least one of the one or several conducting elements extends along said one of said one or several slots.

4. The interconnect device according to claim 1, wherein the cavity passes through the thickness of the support.

5. The interconnect device according to claim 1, wherein the bottom of the cavity is blind.

6. The interconnect device according to claim 1, wherein said one or several slots communicate with said first opening, and one or several other slots formed in the second substrate along the cavity formed in said substrate communicate with the second opening.

7. The interconnect device according to claim 1, wherein the walls of the cavity are covered with conducting material.

8. A method for making an interconnect device according to claim 1, comprising:
forming conducting pads passing through the support; and
forming the cavity in the thickness of the support so as to open and remove part of the conducting pads, the other part of the conducting pads being kept and forming conducting elements housed in grooves.

9. A method for making an interconnect device according to claim 1, comprising:
forming the cavity in the thickness of the support;
forming an area with a conducting base covering the walls of the cavity; and
forming at least one slot so as to open the conducting material, the slot communicating with the cavity.

10. A method for making an interconnect device according to claim 1, comprising:
forming the cavity in the thickness of the support and slots communicating with said cavity and extending over all or part thereof;
forming a layer of sacrificial material in the slots, so as to separate the slots from the cavity;
forming a conducting layer on the walls of the cavity; and
removing the layer of sacrificial material so as to remove portions of the conducting layer between the slots and the cavity.

11. A method for making an interconnect device according to claim 1, comprising:
forming the cavity in the thickness of the support;
forming at least one slot communicating with said cavity and extending over all or part thereof, said slot being made to have, in a plane parallel to the support, a variable section with a narrowing at the connection between the slot and the cavity; and
performing a directional deposition of conducting material on said wall and on part of the slot.

12. An interconnect device comprising:
a support in which at least one hole is formed, the hole having walls forming a closed contour and being formed by a cavity and one or several recessed slots in the walls and communicating with the cavity, the one or several slots extending over all or part of the length of the hole, one or several conducting elements being intended to connect conducting areas to each other situated on either side of the support, and the one or several conducting elements covering, inside the hole, at least part of the walls of the cavity and only a portion of an inside of the slots, the slots ensuring an electrical discontinuity between conducting elements in the slots and conducting elements of the cavity.

13. The interconnect device according to claim 12, wherein the cavity passes through the thickness of the support.

14. The interconnect device according to claim 12, wherein the cavity is formed by a blind orifice formed in the support.

15. The interconnect device according to claim 12, wherein the support is formed by several superimposed substrates and/or layers.

16. The interconnect device according to claim 12, wherein the support is formed by several superimposed substrates and/or layers, and the cavity is formed by a first opening made in a first substrate and a second opening with a section different from the first opening and made in a second substrate.

17. The interconnect device according to claim 16, wherein the bottom of the cavity is blind, said one or several slots communicate with said first opening, and one or several other slots formed in the second substrate along the cavity formed in said substrate communicate with the second opening.

18. A method for making an interconnect device according to claim 12, comprising the steps consisting of:
a. forming a cavity in the thickness of the support,
b. forming at least one slot communicating with said cavity and extending over all or part thereof, said slot being made such that it has, in a plane parallel to the support, a variable section with a narrowing at the connection between the slot and the cavity,
c. performing a directional deposition of conducting material on said wall and on part of the slot.

\* \* \* \* \*